(12) United States Patent
Watanabe

(10) Patent No.: US 10,429,735 B2
(45) Date of Patent: Oct. 1, 2019

(54) COATING AGENT FOR REDUCING ROUGHNESS OF RESIST PATTERN, AND METHOD FOR FORMING RESIST PATTERN IN WHICH ROUGHNESS IS REDUCED

(71) Applicant: TOKYO OHKA KOGYO CO., LTD., Kawasaki-shi (JP)

(72) Inventor: Ryoji Watanabe, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/724,591

(22) Filed: Oct. 4, 2017

(65) Prior Publication Data
US 2018/0102246 A1   Apr. 12, 2018

(30) Foreign Application Priority Data
Oct. 6, 2016 (JP) ................... 2016-198451

(51) Int. Cl.
| | | |
|---|---|---|
| *G03F 7/11* | (2006.01) | |
| *C08L 71/02* | (2006.01) | |
| *C08F 8/14* | (2006.01) | |
| *G03F 7/00* | (2006.01) | |
| *G03F 7/40* | (2006.01) | |
| *H01L 21/02* | (2006.01) | |
| *H01L 21/027* | (2006.01) | |
| *H01L 21/302* | (2006.01) | |
| *H01L 21/311* | (2006.01) | |

(52) U.S. Cl.
CPC ............. *G03F 7/11* (2013.01); *C08F 8/14* (2013.01); *C08L 71/02* (2013.01); *G03F 7/0035* (2013.01); *G03F 7/40* (2013.01); *G03F 7/405* (2013.01); *H01L 21/0212* (2013.01); *H01L 21/0273* (2013.01); *H01L 21/0275* (2013.01); *H01L 21/302* (2013.01); *H01L 21/31127* (2013.01)

(58) Field of Classification Search
CPC . G03F 7/004; G03F 7/002; G03F 7/11; G03F 7/161; G03F 7/26; G03F 7/36; G03F 7/40; C08L 71/02

USPC ......... 430/271.1, 273.1, 322, 325, 329, 330, 430/331
See application file for complete search history.

(56) References Cited

U.S. PATENT DOCUMENTS

| | | | | |
|---|---|---|---|---|
| 3,364,164 A | * | 1/1968 | Lyons ................. | C08F 8/00 524/245 |
| 5,679,485 A | * | 10/1997 | Suzuki ................. | G03F 7/033 430/18 |
| 5,714,533 A | * | 2/1998 | Hatakeyama ....... | B60C 1/00 524/140 |
| 7,196,147 B2 | * | 3/2007 | Wang ................. | C08F 10/00 526/113 |
| 7,338,750 B2 | | 3/2008 | Kozawa et al. | |
| 2003/0143490 A1 | | 7/2003 | Kozawa et al. | |
| 2005/0031987 A1 | * | 2/2005 | Nozaki .............. | G03F 7/0035 430/270.1 |
| 2005/0277054 A1 | * | 12/2005 | Nozaki .............. | G03F 7/0035 430/270.1 |
| 2008/0073322 A1 | * | 3/2008 | Nozaki .............. | C08K 5/17 216/49 |
| 2013/0179357 A1 | * | 7/2013 | Den Herder ...... | G06Q 30/0206 705/306 |
| 2013/0316231 A1 | * | 11/2013 | Iijima ................. | C09D 5/14 429/211 |
| 2014/0187660 A1 | * | 7/2014 | Allen ................. | C08G 64/0208 521/172 |

FOREIGN PATENT DOCUMENTS

JP     2003-215814 A     7/2003

* cited by examiner

*Primary Examiner* — Amanda C. Walke
(74) *Attorney, Agent, or Firm* — Knobbe, Martens, Olson & Bear LLP

(57) ABSTRACT

A coating agent capable of favorably reducing the roughness of a resist pattern, and a method for forming a resist pattern in which roughness is reduced. The method includes coating the resist pattern with the coating agent. The coating agent is a composition including a resin, an amine compound, and a solvent, the amine compound having an aliphatic hydrocarbon group having 8 to 20 carbon atoms and having 1 or more unsaturated double bond and a group having a specific amount of ethylene oxide and/or propylene oxide added thereto.

7 Claims, No Drawings

COATING AGENT FOR REDUCING ROUGHNESS OF RESIST PATTERN, AND METHOD FOR FORMING RESIST PATTERN IN WHICH ROUGHNESS IS REDUCED

This application claims priority to Japanese Patent Application No. 2016-198451, filed Oct. 6, 2016, the entire content of which is incorporated herein by reference.

BACKGROUND OF THE INVENTION

Field of the Invention

The present invention relates to a coating agent for reducing the roughness of a resist pattern, and a method for forming a resist pattern in which roughness is reduced.

Related Art

In the production of electronic components, such as semiconductor devices and liquid crystal devices, photolithographic techniques have been used when a process such as etching is performed on a substrate. In the photolithographic techniques, a coat film (resist layer) is formed on a substrate using a so-called photoresist material responsive to actinic radiation, then the resist layer is selectively irradiated with the actinic radiation in order to perform light exposure, and thereafter a developing treatment is performed to selectively dissolve and remove the resist layer so as to form an image pattern (resist pattern) on the substrate. Then, a wiring pattern is formed on the substrate by carrying out an etching process with this resist pattern as a protective layer (mask pattern).

In unison with a recent growing tendency to highly integrate and miniaturize semiconductor devices, fine-fabrication in the formation of these resist patterns has also advanced and thus ultra-fine-processing is required. In addition to attempt to achieve such ultra-fine-fabrication of the resist pattern, research and development of techniques have been performed in order for the pattern fine-fabrication to exceed the resolution limit of the resist materials also in view of pattern formation methods.

For example, as a method of forming an ultra-fine resist pattern, a method using a coating agent containing at least one selected from a water-soluble resin and an alkali-soluble resin is known (Patent Document 1). According to the method described in Patent Document 1, an ultra-fine resist pattern is formed by applying a coating agent on the surface of a resist pattern formed on a substrate to form a coat film, and then developing with water or a weakly alkaline aqueous solution. According to the method described in Patent Document 1, an ultra-fine resist pattern is formed by applying a coating agent on the surface of a resist pattern formed on a substrate to form a coat film, and then developing with water or a weakly alkaline aqueous solution.

In the method, the coat film is formed on the surface of a resist pattern having a resist section comprising a resist composition and a nonresist section, and then the surface of the resist section is impregnated with a resin component contained in the coat film to form a mixing layer on the surface of the resist section. Then, through removal of the mixing layer along with the coat film by development, a fine resist pattern comprising a resist section having a smaller dimension by the amount of the removed mixing layer as compared with that of the resist pattern before applying the coating agent (hereinafter, a process of fining a resist pattern by reducing a dimension of a resist section through removal and dissolution of a surface layer of the resist pattern is also referred to as slimming).

Patent Document 1: Japanese Unexamined Patent Application, Publication No. 2003-215814

SUMMARY OF THE INVENTION

In general, fine unevenness is present on the surface of a resist section in a resist pattern, and it is desired to reduce the roughness of the surface of the resist section due to this fine unevenness. However, when fining a resist pattern by the method of forming a mixing layer described in Patent Document 1, it is difficult to reduce the roughness of the surface of a resist section in a resist pattern. The reason behind this is as follows: in the case of the method described in Patent Document 1, a mixing layer is formed by impregnating the surface of a resist section with a resin component in a coat film, and therefore the mixing layer is formed into a shape reflecting the unevenness on the surface of the resist section.

The present invention was made in view of the foregoing problems, and an object of the invention is to provide a coating agent capable of favorably reducing the roughness of a resist pattern and a method for forming a resist pattern in which roughness is reduced, the method comprising coating the resist pattern with the coating agent.

The present inventors have found that the problems described above can be solved by way of using, as a coating agent for coating a resist pattern formed on a substrate to reduce the roughness of the resist pattern, a composition comprising a resin (A), an amine compound (B), and a solvent (S), in which the amine compound (B) has an aliphatic hydrocarbon group having 8 or more and 20 or less carbon atoms and having 1 or more unsaturated double bond and a group having a specific amount of ethylene oxide and/or propylene oxide added thereto. Then the present inventors have completed the present invention. More specifically, the present invention provides the following.

A first aspect of the present invention provides a coating agent for coating a resist pattern formed on a substrate to reduce the roughness of the resist pattern, the coating agent comprising:

a resin (A), an amine compound (B), and a solvent (S), the amine compound (B) is a compound represented by the following formula (1):

(1)

wherein, in formula (1), $R^1$ represents an aliphatic hydrocarbon group having 8 or more and 20 or less carbon atoms and having 1 or more unsaturated double bond, $R^2$ represents a group represented by -(A-O)$_q$—$R^4$, $R^3$ represents a group represented by -(A-O)$_r$—$R^4$, A represents an ethylene group or a propylene group, $R^4$ represents a hydrogen atom or an alkyl group, q and r each independently represents a positive number, and q+r represents 4 or more.

A second aspect of the present invention provides a method for forming a resist pattern in which roughness is reduced, the method comprising:
coating the resist pattern on a substrate with a coat film composed of the coating agent according to the first aspect; and
removing the coat film from the surface of the resist pattern.

According to the present invention, a coating agent capable of favorably reducing the roughness of a resist pattern and a method for forming a resist pattern in which roughness is reduced can be provided, where the method comprises coating the resist pattern with the coating agent.

DETAILED DESCRIPTION OF THE INVENTION

<<Coating Agent for Reducing Pattern Roughness>>

A coating agent for reducing pattern roughness (hereinafter, referred to as a coating agent) comprises a resin (A), an amine compound (B) of a predetermined structure, and a solvent (S). Treating a resist pattern by a predetermined method using the coating agent can reduce the roughness of the surface of a resist of the resist pattern. Below, essential or optional components to be included in the coating agent for reducing pattern roughness will be described.

<Resin (A)>

The coating agent comprises the resin (A). In a case where the coating agent comprises the resin (A), the surface of a resist pattern is easily coated with a coat film having a desired and uniform thickness. Further, the effects of roughness improvement due to the coating agent can be enhanced by blending the resin (A) into the coating agent. The type of the resin (A) is not particularly limited. Examples of the resin (A) may include a water-soluble polymer, a water-insoluble polymer, an alkali-soluble polymer, and the like. A water-soluble polymer and an alkali-soluble polymer are preferable. Below, the water-soluble polymer and the alkali-soluble polymer preferably used as the resin (A) will be described.

[Water-Soluble Polymer]

There is no particular limitation for the type of the water-soluble polymer as long as it can be uniformly dissolved into the coating agent at a concentration capable of forming a coat film having a desired film thickness on a positive-type resist pattern, which does not undergo gelation when dissolved in the coating agent.

Suitable examples of the water-soluble polymer include at least one selected from a polymer of one or more acrylic monomers, a polymer of one or more vinyl based monomers, a copolymer of an acrylic monomer and a vinyl based monomer, a cellulose based resin, an amide based resin and a water-soluble peptide.

Acrylic monomers include, for example, acrylic acid, methyl acrylate, methacrylic acid, methyl methacrylate, N,N-dimethylacrylamide, N,N-dimethylaminopropyl methacrylamide, N,N-dimethylaminopropyl acrylamide, N-methylacrylamide, diacetoneacrylamide, N,N-dimethylaminoethyl methacrylate, N,N-diethylaminoethyl methacrylate, N,N-dimethylaminoethyl acrylate, acryloyl morpholine and the like.

Vinyl based monomers include, for example, N-vinylpyrrolidone, vinylimidazolidinone, N-vinylimidazole, vinyl acetate, allylamine and the like.

In a case where a polymer of a vinyl based monomer, or a copolymer of an acrylic monomer and a vinyl based monomer has a constituent unit derived from vinyl acetate, an ester group in the above constituent unit may be hydrolyzed into a vinyl alcohol unit. Further, the hydroxy group in that vinyl alcohol unit may be protected with acetal and the like.

Cellulose based resins include, for example, hydroxypropyl methylcellulose phthalate, hydroxypropyl methylcellulose acetate phthalate, hydroxypropyl methylcellulose hexahydro phthalate, hydroxypropyl methylcellulose acetate succinate, hydroxypropyl methylcellulose, hydroxypropyl cellulose, hydroxyethylcellulose, cellulose acetate hexahydro phthalate, carboxymethyl cellulose, ethyl cellulose, methyl cellulose and the like.

Further, among the amide based resins, resins soluble in water can also be used.

Among these, a vinyl based resin is preferred, and polyvinyl pyrrolidone and polyvinyl alcohol are particularly preferred.

The mass-average molecular weights of a polymer of one or more acrylic monomers, a polymer of one or more vinyl based monomers, a copolymer of an acrylic monomer and a vinyl based monomer, a cellulose based resin and an amide based resin are preferably 500 or more and 500000 or less, more preferably 1000 or more and 200000 or less.

There is no particular limitation for the water-soluble peptide as long as it is highly soluble in water at room temperature, and is resistant to gelation even at low temperature. The mass-average molecular weight of the water-soluble peptide is preferably 10000 or less, more preferably 5000 or less. In a case where the mass-average molecular weight is 10000 or less, it is highly soluble in water, and is resistant to gelation even at low temperature. Therefore, the stability of the solution will be high. Note that the lower limit of the mass-average molecular weight is preferably 500 or more. Further, the water-soluble peptide may be derived from a natural product, or may be a synthetic material. Moreover, it may be a derivative of the water-soluble peptide.

Water-soluble peptides include, for example, hydrolyzed peptides from collagen, hydrolyzed peptides from silk proteins, hydrolyzed peptides from soybean proteins, hydrolyzed peptides from wheat proteins, hydrolyzed peptides from rice proteins, hydrolyzed peptides from sesame proteins, hydrolyzed peptides from *Pisum sativum* proteins, hydrolyzed peptides from wool proteins, hydrolyzed peptides from casein and the like.

These water-soluble polymers may be used alone, or may be used as a mixture of two or more.

[Alkali-Soluble Polymer]

Alkali-soluble polymers include a resin having a hydrophilic alkali-soluble functional group such as a phenolic hydroxy group and a carboxyl group. Specific examples of the alkali-soluble polymer include, for example, a novolak resin, a resin (a PHS based resin) having a constituent unit derived from hydroxystyrene such as polyhydroxystyrene (PHS) and hydroxystyrene-styrene copolymer, an acrylic resin containing a constituent unit derived from acrylic ester and the like. Any one of these may be used alone, or two or more may be used in combination.

There is no particular limitation for the amount of the resin (A) in the coating agent, but it is appropriately selected in view of the viscosity of the coating agent and the like. In a case where the content of the resin (A) in the coating agent is preferably 0.01% by mass or more and 10% by mass or less, more preferably 0.1% by mass and more and 5% by mass or less, in particular preferably 0.1% by mass or more and 2% by mass or less when the total mass of the coating agent is taken as 100 mass %.

<Amine Compound (B)>

The coating agent comprises the amine compound (B) of a specific structure. Specifically, the amine compound (B) is a compound represented by the following formula (1):

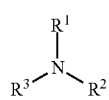

(1)

wherein, in formula (1), $R^1$ represents an aliphatic hydrocarbon group having 8 or more and 20 or less carbon atoms and having 1 or more unsaturated double bond, $R^2$ represents a group represented by $-(A-O)_q-R^4$, $R^3$ represents a group represented by $-(A-O)_r-R^4$, A represents an ethylene group or a propylene group, $R^4$ represents a hydrogen atom or an alkyl group, q and r each independently represents a positive number, and q+r represents 4 or more.

For the compound represented by formula (1), $R^1$ represents an aliphatic hydrocarbon group having 8 or more and 20 or less carbon atoms and having 1 or more unsaturated double bond.

The number of carbon atoms in the aliphatic hydrocarbon group as $R^1$ is 8 or more and 20 or less, preferably 10 or more and 20 or less, more preferably 12 or more and 20 or less, particularly preferably 16 or more and 20 or less.

The aliphatic hydrocarbon group as $R^1$ has 1 or more unsaturated double bond. The number of unsaturated double bonds in the aliphatic hydrocarbon group as $R^1$ is not particularly limited, but is preferably 1 or more and 4 or less, more preferably 1 or 2, particularly preferably 1.

Examples of the aliphatic hydrocarbon group as $R^1$ may include a linear or branched aliphatic hydrocarbon group, a cyclic aliphatic hydrocarbon group (alicyclic hydrocarbon group), an aliphatic hydrocarbon group having a structure that is derived from a combination of these, or the like. Among these, a linear aliphatic hydrocarbon group is preferable.

Preferable examples of the linear aliphatic hydrocarbon group having 1 or more unsaturated double bond may include an n-octenyl group, an n-nonenyl group, an n-decenyl group, an n-undecenyl group, an n-dodecenyl group, an n-tridecenyl group, an n-tetradecenyl group, an n-pentadecenyl group, an n-hexadecenyl group, an n-heptadecenyl group, an n-octadecenyl group, an n-nonadecenyl group, an n-icosenyl group, an n-octadienyl group, an n-nonadienyl group, an n-decadienyl group, an n-dodecadienyl group, an n-tridecadienyl group, an n-tetradecadienyl group, an n-pentadecadienyl group, an n-hexadecadienyl group, an n-heptadecadienyl group, an n-octadecadienyl group, an n-nonadecadienyl group, an n-icosadienyl group, and the like.

For the groups represented by $-(A-O)_q-R^4$ and $-(A-O)_r-R^4$ that are $R^2$ and $R^3$, respectively, in the compound represented by formula (1), q and r each independently represents the average addition numbers of ethylene oxide and/or propylene oxide to a nitrogen atom and, in some cases, they are positive numbers but may not be integers.

For the groups represented by $-(A-O)_q-R^4$ and $-(A-O)_r-R^4$ in the compound represented by formula (1), $R^4$ is a hydrogen atom or an alkyl group, and preferably a hydrogen atom. When $R^4$ is an alkyl group, the number of carbon atoms of the alkyl group is preferably 1 or more and 6 or less, and more preferably 1 or more and 4 or less. When $R^4$ is an alkyl group, specific examples of the alkyl group include a methyl group, an ethyl group, an n-propyl group, an isopropyl group, an n-butyl group, an n-pentyl group, and an n-hexyl group.

For the compound represented by formula (1), it is preferable that $R^2$ represent the group represented by $-(A-O)_q-H$ and $R^3$ represent the group represented by $-(A-O)_r-H$.

For formula (1), the value of q+r is 4 or more, preferably 4 or more and 20 or less, and more preferably 4 or more and 15 or less. As amine compound (B), in order for the value of q+r to be within the above range, the compound that is added with ethylene oxide and/or propylene oxide to a nitrogen atom is combined with a coating agent, and thereby, a roughness of resist pattern can be favorably reduced A preferable example of the compound represented by formula (1) may include a compound represented by the following formula (1-1). For the following formula, $-C_{18}H_{35}$ represents an n-octadecenyl group, q and r represent positive numbers, and q+r represents 4 or more.

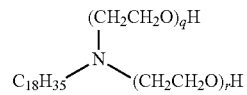

The amine compound (B) has a surfactant-like property by having an oxyethylene unit, an oxypropylene unit, and a long-chain unsaturated aliphatic hydrocarbon group. Therefore, in the case of using the coating agent, the amine compound (B) is favorably adsorbed onto the surface of a resist section in a resist pattern. The cause of this phenomenon is deemed to be as follows: the amine compound (B) adsorbed onto the surface of the resist section promotes the solubilization of a raised portion in the unevenness of a surface layer of the resist section by the surfactant-like function thereof.

Usually, fine unevenness and a small amount of an alkali-soluble group from undissolved residues in the development process are present on the surface of a side of a resist section. Because of this, part of the surface of a side of a resist section where the alkali-soluble group is exposed appears to be dissolved in the amine compound (B) based on its basic properties when well adsorbed into the side of the resist section. In contrast, in the case of a positive type resist pattern, the alkali-soluble groups are not mostly present at the apex portion of an unexposed resist section; and in the case of a negative type resist pattern, no unexposed resist composition readily soluble in alkali is present at the apex portion of the resist section.

Because of this, the amine compound (B) mostly does not affect the apex portion of the resist section of the resist pattern and does not cause the dissolution of a resist at the apex portion of the resist section of the resist pattern although adsorbed therein. Therefore, it is conceived that when performing coating of a pattern using the coating agent according to the present invention, a side of a resist pattern can be smoothed, and the roughness of the resist pattern can be reduced without causing the height of a patterned section to be decreased and without causing the cross-sectional shape of the patterned section to be round at the apex portion.

Depending on the structure of the amine compound (B), the coating agent of the present invention is capable of either reducing roughness while fine-fabricating a pattern (slimming) or reducing roughness without fine-fabricating a pattern (slimming). As the value of q+r increases for the compound represented by formula (1), a resist pattern treated with the coating agent tends to be fine-fabricated (slimmed).

The amine compound (B) described above may be used in combination of a plurality of types. The content of the amine compound (B) in the coating agent is not particularly limited in the range that does not hinder the objects of the present invention. The content of the amine compound (B) in the coating agent is preferably 0.001% by mass or more and 1% by mass or less, more preferably 0.01% by mass or more and 0.8% by mass or less, and particularly preferably 0.05% by mass or more and 0.5% by mass or less with respect to the total liquid amount of the coating agent.

<Solvent (S)>

The coating agent comprises the solvent (S). The coating agent is used as a solution including the resin (A) as described above and the amine compound (B) as described above dissolved in the solvent (S). The solvent (S) is typically water, but may alternatively be an organic solvent or a mixed solvent of water and an organic solvent.

In an aspect, the coating agent preferably comprises water as the solvent (S). In a case where the solvent (S) is water or a mixed solvent of water and an organic solvent, the resist pattern tends not to be dissolved or swollen and thereby it is easy to remove the coat film formed with the coating agent. In another aspect, the coating agent preferably comprises an organic solvent alone as the solvent (S). In a case where the coating agent comprises an organic solvent alone as the solvent (S), even if a resist pattern is coated with the coating agent using a cup for applying a resist composition, cloudiness is not developed in the cup. Therefore, cup exchange is not required when performing coating with the coating agent, and a resist pattern in which roughness is reduced can be effectively formed. Further, the coating agent comprising an organic solvent alone as the solvent (S) has a good wettability on a resist pattern and therefore allows easy formation of a coat film on a fine resist pattern.

The solid concentration of the coating agent is preferably 0.1% by mass or more and 30% by mass or less, more preferably 0.5% by mass or more and 20% by mass or less, most preferably 1% by mass or more and 10% by mass or less.

[Organic Solvent]

Below, the organic solvent that can be used alone or in combination with water as a mixed solvent to serve as a solvent for the coating agent will be described. The organic solvent is appropriately selected from various organic solvents not dissolving a resist pattern is. As the organic solvent, preferred are those in which a resist pattern is essentially insoluble. However, the organic solvent shall not be limited to those in which a resist pattern is completely insoluble. For example, in a case where a resist pattern is brought into contact with an organic solvent at room temperature, an organic solvent is allowed to use in which the resist pattern is dissolved to an extent where the width thereof is decreased by only 1 nm or less, preferably 0.5 nm or less.

Examples of a suitable organic solvent include one or more selected from the group consisting of alcohols optionally having a fluorine atom, hydrocarbons, ethers not having a hydroxy group and fluorinated aliphatic hydrocarbons optionally having an ether linkage or an ester linkage. Below, the suitable organic solvents will be described.

(Alcohols Optionally Having a Fluorine Atom)

The alcohol may be a monohydric alcohol or a polyhydric alcohol with a valency of 2 or more. The alcohol may be alkanol not having a fluorine atom, or may be fluoroalkanol having a fluorine atom. Further, the alcohol may include an ether linkage. Furthermore, the alcohol may have a chain structure or a cyclic structure, or may have a structure in which a chain structure and a cyclic structure are combined.

Specific examples of the chain alcohol having neither a fluorine atom nor an ether linkage include methanol, ethanol, n-propanol, isopropyl alcohol, propylene glycol, n-butanol, isobutanol, sec-butanol, tert-butanol, n-pentanol, sec-pentanol, tert-pentanol, isopentanol, neopentyl alcohol, 2-methyl-1-butanol, n-hexanol, 4-methyl-2-pentanol, 2-ethylbutanol, n-heptanol, 3-heptanol, 5-methyl-1-hexanol, n-octanol, 2-octanol, 3-octanol, 4-octanol, 6-methyl-2-heptanol and 2-ethyl-1-hexanol.

Specific examples of the alcohol having a cyclic structure including neither a fluorine atom nor an ether linkage include cyclopentanemethanol, 1-cyclopentylethanol, cyclohexanol, cyclohexanemethanol (CM), cyclohexaneethanol, 1,2,3,6-tetrahydro benzyl alcohol, exo-norborneol, 2-methyl cyclohexanol, cycloheptanol, 3,5-dimethylcyclohexanol and benzyl alcohol.

Specific examples of the chain alcohol having an ether linkage but not a fluorine atom include monomethyl ether, monoethyl ether, monopropyl ether or monobutyl ether of a polyhydric alcohol selected from ethylene glycol, diethylene glycol, propylene glycol, dipropylene glycol, glycerin, 1,2-butylene glycol, 1,3-butylen glycol, and 2,3-butylene glycol. Among these, preferred are propylene glycol monobutyl ether (1-butoxy-2-propanol), propylene glycol monopropyl ether (1-propoxy-2-propanol), 2-(2-butoxyethoxy)ethanol.

The number of carbon atoms of the alcohol having a fluorine atom is preferably 4 or more and 12 or less. Specific examples of the alcohol having a fluorine atom include $C_4F_9CH_2CH_2OH$ and $C_3F_7CH_2OH$.

Among the alcohols recited above, preferred are 1-butoxy-2-propanol (BP), isobutanol (2-methyl-1-propanol), 4-methyl-2-pentanol, n-butanol, propylene glycol monopropyl ether.

(Hydrocarbons)

The hydrocarbon is appropriately selected from paraffin based solvents. Examples of the hydrocarbon include n-heptane.

(Ethers not Having a Hydroxy Group)

Suitable examples of the ethers not having a hydroxy group include compounds represented by the following formula $R^{s1}$—O—$R^{s2}$. In the above formula, $R^{s1}$ and $R^{s2}$ each independently represents a monovalent hydrocarbon group, and $R^{s1}$ and $R^{s2}$ may join together to form a ring.

Suitable examples of $R^{s1}$ and $R^{s2}$ include an alkyl group, an aryl group, an aralkyl group and the like, and an alkyl group is preferred. Each of $R^{s1}$ and $R^{s2}$ is preferably an alkyl group, and $R^{s1}$ and $R^{s2}$ are preferably the same alkyl group.

In a case where $R^{s1}$ and $R^{s2}$ are alkyl groups, there is no particular limitation for the structure and the number of carbon atoms thereof. The number of carbon atoms of the alkyl group is preferably 1 or more and 20 or less, more preferably 1 or more and 15 or less, and in particular preferably 1 or more and 10 or less. The structure of the alkyl group may be any of linear, branched and cyclic.

Specific examples of the alkyl group include a methyl group, an ethyl group, an n-propyl group, an isopropyl group, an n-butyl group, an isobutyl group, an n-pentyl group, an isopentyl group, a cyclopentyl group, a hexyl group and the like, and an n-butyl group and an isopentyl group are particularly preferred.

In a case where $R^{s1}$ and $R^{s2}$ are aryl groups or aralkyl groups, there is no particular limitation for the structure and the number of carbon atoms thereof. The number of carbon atoms of the aryl group or the aralkyl group is preferably 6 or more and 12 or less, and more preferably 6 or more and 10 or less. For an aromatic ring in the aryl group or the aralkyl group, a part or all of the hydrogen atoms on the aromatic ring may be substituted with an alkyl group, an alkoxy group, a halogen atom and the like.

Specific examples of the aryl group or the aralkyl group include a phenyl group, a benzyl group, a naphthyl group and the like. In a case where the aryl group or the aralkyl group has an alkyl group as a substituent on the aromatic ring, the above alkyl group is preferably an alkyl group having 1 or more an 5 or less carbon atoms, more preferably a methyl group, an ethyl group, a propyl group, an n-butyl group and a tert-butyl group.

In a case where the aryl group or the aralkyl group has an alkoxy group as a substituent on the aromatic ring, the above alkoxy group is preferably an alkoxy group having 1 or more and 5 or less carbon atoms, more preferably a methoxy group and an ethoxy group.

In a case where the aryl group or the aralkyl group has a halogen atom as a substituent on the aromatic ring, the above halogen atom is preferably a fluorine atom.

In a case where $R^{s1}$ and $R^{s2}$ join together to form a ring, $R^{s1}$ and $R^{s2}$ are each independently a linear or branched alkylene group (preferably an alkylene group having 1 or more and 10 or less carbon atoms), and the end of $R^{s1}$ joins with the end of $R^{s2}$ to form a ring. Further, the above alkylene group may include an ether linkage in the chain thereof. Specific examples of the ethers in which $R^{s1}$ and $R^{s2}$ form a ring include 1,4-cineole, 1,8-cineole, pinene oxide, tetrahydrofuran, dioxane and the like.

Specific examples of the ethers not having a hydroxy group include 1,4-cineole, 1,8-cineole, pinene oxide, dimethyl ether, diethyl ether, methyl ethyl ether, di-n-propyl ether, diisopropyl ether, di-n-butyl ether, di-n-pentyl ether, diisopentyl ether (diisoamyl ether), dioxane, anisole, ethylbenzyl ether, diphenyl ether, dibenzyl ether, phenetole, butyl phenyl ether, tetrahydrofuran, ethyl propyl ether, diisopropyl ether, dihexyl ether, dipropyl ether and the like. Among these, 1,8-cineole, di-n-butyl ether and diisopentyl ether are preferred.

(Fluorinated Aliphatic Hydrocarbon Optionally Having an Ether Linkage or an Ester Linkage)

The number of carbon atoms of the fluorinated aliphatic hydrocarbon optionally having an ether linkage or an ester linkage is preferably 3 or more and 15 or less.

The fluorinated aliphatic hydrocarbon having an ether linkage is preferably a fluorinated alkyl ether represented by $R^{s3}OR^{s4}$ (wherein $R^{s3}$ and $R^{s4}$ each independently represents an alkyl group, and the total number of carbon atoms in the both alkyl groups is 3 or more and 15 or less, and at least a part or all of the hydrogen atoms thereof is(are) substituted with a fluorine atom. $R^{s3}$ and $R^{s4}$ may join together to form a ring.).

The fluorinated aliphatic hydrocarbon having an ester linkage is preferably a fluorinated alkyl ester represented by $R^{s5}COOR^{s6}$ ($R^{s5}$ and $R^{s6}$ each independently represents an alkyl group, and the total number of carbon atoms in the both alkyl groups is 3 or more and 15 or less, and at least a part or all of the hydrogen atoms thereof is(are) substituted with a fluorine atom).

Suitable examples of the above fluorinated alkyl ether include a compound represented by the following formula (S-1) and fluoro-2-butyltetrahydrofuran. Further, suitable examples of the above fluorinated alkyl ester include compounds represented by the following formulae (S-2) and (S-3).

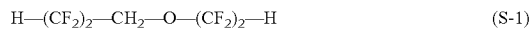

Among the organic solvents described above, preferred are isobutanol (2-methyl-1-propanol), 4-methyl-2-pentanol, propylene glycol monobutyl ether (1-butoxy-2-propanol (BP)), propylene glycol monopropyl ether (1-propoxy-2-propanol) and diisopentyl ether (diisoamyl ether).

<Basic Compound (C)>

The coating agent preferably further comprises a basic compound (C). The basic compound (C) is a compound different from the amine compound (B). Blending the basic compound (C) in the coating agent can improve the roughness reducing effect of the coating agent.

The basic compound (C) is preferably a water-soluble amine compound and a basic quaternary ammonium salt, more preferably a basic quaternary ammonium salt.

Specific examples of the water-soluble amine compound include alkanolamines such as monoethanolamine, diethanolamine, triethanolamine, 2-(2-aminoethoxy)ethanol, N,N-dimethylethanolamine, N,N-diethylethanolamine, N,N-dibutylethanolamine, N-methylethanolamine, N-ethylethanolamine, N-butylethanolamine, N-methyldiethanolamine, monoisopropanolamine, diisopropanolamine, triisopropanolamine; polyalkylene polyamines such as diethylenetriamine, triethylenetetramine, propylenediamine, N,N-diethylethylenediamine, 1,4-butanediamine, N-ethylethylenediamine, 1,2-propanediamine, 1,3-propanediamine, 1,6-hexanediamine; aliphatic amines such as 2-ethyl-hexylamine, dioctylamine, triethylamine, tributylamine, tripropylamine, triallylamine, heptylamine, cyclohexylamine, tetrahydrofurfurylamine; aromatic amines such as benzylamine, diphenylamine; cyclic amines such as piperazine, N-methyl-piperazine, hydroxyethyl piperazine, 1,4-diazabicyclo(2,2,2)octane, 1,8-diazabicyclo(5,4,0)-7-undecene and the like.

The basic quaternary ammonium salt is preferably a quaternary ammonium hydroxide represented by the following formula (C1).

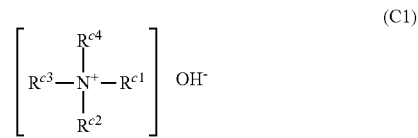

(C1)

In the formula (C1), $R^{c1}$, $R^{c2}$, $R^{c3}$, $R^{c4}$ are the same, or are different, and each independently represents a group selected from the group consisting of an alkyl group, a hydroxyalkyl group and an aralkyl group.

In the formula (C1), in a case where $R^{c1}$, $R^{c2}$, $R^{c3}$ and $R^{c4}$ are an alkyl group or a hydroxyalkyl group, there is no particular limitation for the number of carbon atoms in the alkyl group and the hydroxyalkyl group, but the number is preferably 1 or more and 8 or less, more preferably 1 or more and 6 or less. Specific examples of the alkyl group include a methyl group, an ethyl group, an n-propyl group, an isopropyl group, an n-butyl group, an isobutyl group, a sec-butyl group, a tert-butyl group, an n-pentyl group, an n-hexyl group, an n-heptyl and an n-octyl group. Specific examples of the hydroxyalkyl group include a hydroxymethyl group, 2-hydroxyethyl group, a 3-hydroxy-n-propyl group, a 4-hydroxy-n-butyl group, a 5-hydroxy-n-pentyl group, a 6-hydroxy-n-hexyl group, a 7-hydroxy-n-heptyl group, an 8-hydroxy-n-octyl group.

In the formula (C1), in a case where $R^{c1}$, $R^{c2}$, $R^{c3}$ and $R^{c4}$ are aralkyl groups, there is no particular limitation for the number of carbon atoms in the aralkyl group, but the number is preferably 7 or more and 12 or less. Specific examples of the aralkyl group include a benzyl group, a phenethyl group, an α-naphthylmethyl group, a β-naphthylmethyl group, an α-naphthylethyl group, a β-naphthylethyl group and the like.

Specific examples of the quaternary ammonium hydroxide represented by the formula (C1) include tetramethylammonium hydroxide, trimethyl(2-hydroxyethyl)ammonium hydroxide, tetraethylammonium hydroxide, tetrapropylammonium hydroxide, tetrabutylammonium hydroxide, methyltripropylammonium hydroxide, methyltributylammonium hydroxide, benzyltrimethylammonium hydroxide, benzyltriethylammonium hydroxide and the like.

The content of the basic compound (C) in the coating agent is not particularly limited in the range that does not hinder the object of the present invention. In a case where the mass of the coating agent is 100% by mass, the content of the basic compound (C) is preferably 0.1% by mass or more and 5% by mass or less, more preferably 0.1% by mass or more and 1% by mass or less.

<Optional Additive (D)>

The coating agent may comprise an optional additive such as a surfactant, a water-soluble fluorine compound, if desired. Below, these optional additives will be described in order.

Surfactant

A property of not generating a suspension in the coating agent and the like is required for the surfactant.

Further, in a case where the coating agent contains the resin (A) such as the water-soluble polymer or the alkali-soluble polymer, the surfactant desirably has a high solubility in the resin (A). The use of such a surfactant that complies with these characteristics can suppress generation of air bubbles (microfoam), especially when applying the coating agent, thereby more effectively enabling prevention of defect generation reportedly related to the microfoam generation. In view of the foregoing aspects, one or more of a surfactant based on a phosphoric acid ester of polyoxyethylene, and a nonionic-based surfactant may be preferably used.

As the aforementioned surfactant based on a phosphoric acid ester of polyoxyethylene, a compound represented by the following formula (D1) is preferred.

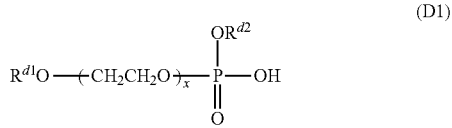
(D1)

In the above formula (D1), $R^{d1}$ represents an alkyl group or an alkylallyl group having 1 or more and 10 or less carbon atoms; $R^{d2}$ represents a hydrogen atom or $(CH_2CH_2O)R^{d1}$ (wherein $R^{d1}$ is as defined above); and x represents an integer of 1 or more and 20 or less.

Specifically, as such a surfactant based on a phosphoric acid ester of polyoxyethylene, commercially available products such as "Plysurf A212E" and "Plysurf A210G" (both manufactured by Dai-ichi Kogyo Seiyaku Co., Ltd.) can be preferably used.

The aforementioned nonionic surfactant is preferably an alkyl etherified product of polyoxyalkylene, or an alkylamine oxide compound.

As the alkyl etherified product of polyoxyalkylene, a compound represented by the following formula (D2) or (D3) is preferably used.

(D2)

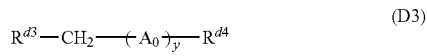
(D3)

In the above formulae (D2) and (D3), $R^{d3}$ and $R^{d4}$ represent a linear, branched or cyclic alkyl group, an alkyl group having a hydroxyl group, or an alkylphenyl group respectively having 1 or more and 22 or less carbon atoms. $A_0$ represents an oxyalkylene group, and is preferably at least one selected from oxyethylene, oxypropylene, and oxybutylene groups. The symbol y represents an integer.

As the alkylamine oxide compound, a compound represented by the following formula (D4) or (D5) is preferably used.

(D4)

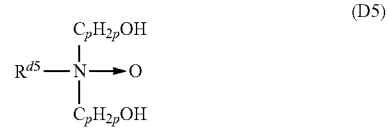
(D5)

In the above formulae (D4) and (D5), $R^{d5}$ represents an alkyl group or a hydroxyalkyl group having 8 or more and 20 or less carbon atoms which may be interrupted with an oxygen atom, and p represent an integer of 1 or more and 5 or less.

Examples of the alkylamine oxide compound represented by the above formula (D4) or (D5) include octyldimethylamine oxide, dodecyldimethylamine oxide, decyldimethylamine oxide, lauryldimethylamine oxide, cetyldimethylamine oxide, stearyldimethylamine oxide, isohexyldiethylamine oxide, nonyldiethylamine oxide, lauryldiethylamine oxide, isopentadecylmethylethylamine oxide, stearylmethylpropylamine oxide, lauryldi(hydroxyethyl)amine oxide, cetyldiethanolamine oxide, stearyldi(hydroxyethyl)amine oxide, dodecyloxyethoxyethoxyethyldi(methyl)amine oxide, stearyloxyethyldi(methyl)amine oxide, and the like.

The added amount of such a surfactant, if any, is preferably 1 ppm by mass or more and 10% by mass or less, more preferably 100 ppm by mass or more and 2% by mass or less when the total mass of the coating agent is taken as 100 mass %.

Water-Soluble Fluorine Compound

A property of not generating a suspension in the coating agent and the like is required for the water-soluble fluorine compound. Further, in a case where the coating agent contains the resin (A) such as the water-soluble polymer or the alkali-soluble polymer, the water-soluble fluorine compound desirably has a high solubility in the resin (A). The use of a water-soluble fluorine compound that complies with such characteristics can improve the leveling property (the extent of the spreading of the coating agent). Although this leveling property can be achieved by lowering of the contact angle by adding an excessive amount of surfactant, when the amount of the surfactant added is in excess, the application improving ability cannot be achieved at a certain level or higher, and furthermore, by adding an excess amount, the air bubbles (microfoam) may be generated on the coat film depending on the application conditions, thereby leading to a problem of potentially causing defects. By combining this water-soluble fluorine compound, the contact angle is lowered while suppressing such foaming, and thus leveling properties can be improved.

As the water soluble fluorine compound, fluoroalkyl alcohols, fluoroalkylcarboxylic acids and the like are preferably used. Examples of the fluoroalkyl alcohols include 2-fluoro-1-ethanol, 2,2-difluoro-1-ethanol, trifluoroethanol, tetrafluoropropanol, octafluoroamyl alcohol, and the like. Examples of the fluoroalkylcarboxylic acids include trifluoroacetic acid, and the like. However, the fluoroalkylcarboxylic acid is not limited to such exemplified compounds, and is acceptable as long as it is a fluorine compound having water solubility, and exhibits the effects described above. In particular, fluoroalkyl alcohols having 6 or less carbon atoms may be preferably used. Among these, in light of ready availability and the like, trifluoroethanol is particularly preferred.

The added amount of such a water-soluble fluorine compound, if any, is preferably 1 ppm by mass or more and 10% by mass or less, more preferably 100 ppm by mass or more and 2% by mass or less when the total mass of the coating agent is taken as 100 mass %.

<<Method for Forming Resist Pattern in which Roughness is Reduced>>

A resist pattern in which roughness is reduced more than that in a resist pattern before coated with a coat film, can be obtained by coating a resist pattern on a substrate with the aforementioned coating agent for reducing roughness of resist pattern and then removing the coat film from the surface of the resist pattern optionally subject to heating. Below, a method for forming a resist pattern in which roughness is reduced by using the aforementioned coating agent will be described in detail.

Fabrication of a substrate having a resist pattern is not particularly limited, but may be performed by using a usual method for fabricating a semiconductor device, a liquid crystal display device, a magnetic head, micro lens, or the like. For example, a photoresist composition is coated on a substrate such as a silicon wafer using a spinner, and then dried to form a photoresist layer. After this, active rays such as ultraviolet rays, deep-UV, and exciplex laser light are irradiated through a desired mask pattern in a vacuum or through the liquid having a predetermined refractive index using a reduction projection exposure device, and the like, or a pattern is drawn by an electron beam, and then the substrate is heated. Next, the development is conducted with a developing solution to form the resist pattern on the substrate.

In addition, the composition for a photoresist that is a material for a resist pattern is not particularly limited, and may be either a positive type photoresist composition or a negative type photoresist composition. Specific examples of the photoresist composition may include a photoresist composition which is generally and widely used, such as a photoresist composition for i and g rays, a photoresist composition for excimer laser, such as KrF, ArF, and $F_2$, a photoresist composition for EB (electron beam), and photoresist for EUV.

Subsequently, the coating agent is applied over the entire surface of a substrate having a resist pattern to coat the resist pattern with a coat film comprising the coating agent. A coating method can be performed in accordance with the method commonly performed in the conventional heat flow process. That is, the above coating agent is applied over the positive resist pattern by a known application method such as spin-coating method using spinner, the bar coater method, the roll coater method, and the slit coater method.

After forming a coat film, heat treatment may be performed, if desired. There is no particular limitation for the heat-treatment temperature as long as good roughness of a resist pattern can be reduced well, but it is preferred to heat at a temperature where the resist pattern does not undergo thermal fluidization. The temperature where a resist pattern does not undergo thermal fluidization refers to a temperature at which no change in the dimension of the above resist pattern is caused (for example, a change in the dimension due to spontaneous fluidization) when heating a substrate on which a coat film comprising the coating agent is not formed, and only the above resist pattern is formed. By performing heating treatment at such a temperature, the solubilization of the side of a patterned section in a resist pattern can be promoted, and a resist pattern having a reduced roughness can be obtained.

The temperature for heating a resist pattern coated with a coat film comprising the coating agent is preferably 60° C. or higher and 140° C. or lower, more preferably 80° C. or higher and 120° C. or lower. There is no particular limitation for the heating time as long as it is in a range where the objects of the present invention are not impaired, but it is preferably for 30 seconds or longer and 90 seconds or shorter.

In addition, the thickness of a coat film composed of the coating agent is not particularly limited and is simply required to be enough for coating a resist pattern.

After forming a coat film or after the aforementioned heat treatment, a coat film comprising the coating agent which remains on a substrate having a resist pattern is removed by washing with water, a water-containing organic solvent, or an organic solvent, for example, depending on the type of the resin (A) contained in the coating agent. By doing this, a side of a resist section in the resist pattern is dissolved in the water, the water-containing organic solvent, the organic solvent, or the like along with the coat film to form a resist pattern in which roughness is reduced.

Note that before removal of the coat film, the substrate having a coat film comprising the coating agent may be washed with an alkaline aqueous solution (for example, tetramethylammonium hydroxide (TMAH), choline and the like), if desired. In a case where removal of the coat film is performed after washing with an alkaline aqueous solution, the coat film and a side of a resist section in the resist pattern are well dissolved, and the roughness of the resist pattern is favorably reduced.

Note that the steps described above may be repeatedly performed until the roughness of a patterned section in the resist pattern is reduced to a desired extent.

By the method described above, a resist pattern in which roughness of a patterned section in a resist pattern is well reduced can be formed by coating the resist pattern using the aforementioned coating agent containing the resin (A), the amine compound (B) of a specific structure, and the solvent (S).

EXAMPLES

Hereinafter, the present invention is explained in more detail by way of Examples of the present invention, but the present invention is not in any way limited to these Examples.

Example 1, Comparative Examples 1 and 2

2.19 parts by mass of polyvinylpyrrolidone (K30, manufactured by Nippon Shokubai Co., Ltd.) as a water-soluble polymer, 0.13 parts by mass of an additional compound that is a type disclosed in Table 1, and 0.18 parts by mass of benzyltrimethylammonium hydroxide as a basic compound were dissolved in ion-exchanged distilled water (97.5 parts by mass) to prepare a coating agent.

In Example 1, Compound 1 represented by the following formula was used as the amine compound (B).

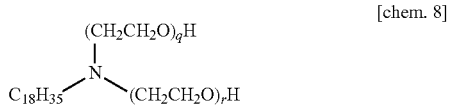

(In the above formula, —$C_{13}H_{35}$ represents an n-octadecenyl group, and the sum of q and r represents 5 as the average addition numbers of ethylene oxide.)

In Comparative Examples 1 and 2, the following Comparative Compounds 1 and 2 were used as the additional compound. Comparative Compound 1: a compound represented by the following formula:

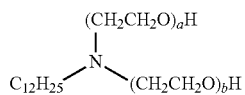

(In the above formula, —$C_{12}H_{25}$ represents an n-dodecyl group, and the sum of a and b represents 13 on average.) Comparative Compound 2: a compound represented by the following formula:

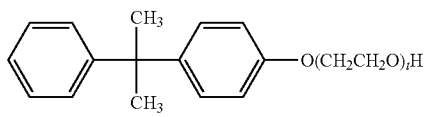

(In the above formula, t represents 11 on average.)
(Evaluation)

After applying an antireflective-film coating liquid (Brewer Science Inc., ARC-29A) on a 12-inch silicon wafer, it was heat-treated for 60 seconds at 205° C. to provide an antireflective film having a film thickness of 89 nm. After applying a positive-type resist composition (Tokyo Ohka Kogyo Co., Ltd., TARF-PI6-144ME) on this antireflective film using a spinner, it was heat-treated for 60 seconds at 120° C. to form a resist film having a film thickness of 90 nm. Exposure treatment was performed on the resist film formed as described above through a mask for forming a line- and space pattern with lines and spaces each having a width of 50 nm, and then heat treatment was performed at 90° C. for 60 seconds. Then, development treatment was performed with a 2.38 mass % aqueous solution of TMAH (tetramethylammonium hydroxide), and then a rinse with ion-exchanged distilled water was performed to obtain a line-and-space pattern.

The coating agents of Examples or Comparative Examples were each applied on the surface of a substrate having a line-and-space pattern using a spinner so that the film thickness of a coat film became 60 nm to coat the surface of the line-and-space pattern with a coat film comprising the coating agent. Then, a coating treatment of the line-and-space pattern was performed by heating the line-and-space pattern coated with the coating agent at 110° C. for 60 seconds. Subsequently, ion-exchanged distilled water was brought into contact with the coat film for 100 seconds for removal of the coat film from the surface of the line-and-space pattern. The following evaluations were performed for the resulting line-and-space pattern subjected to coating treatment.

[Evaluation of the Reduction Amount of Line Width Roughness (LWR)]

First, the line-and-space pattern before performing coating treatment was observed under a scanning electron microscope to measure line widths at 400 locations. The standard deviation (σ) in line width was computed from the values of line widths at 400 locations. Subsequently, a 3-fold value (3σ) of the standard deviation was computed, and the value of 3σ was taken as the roughness (LWR1, nm) of the lines in the untreated line-and-space pattern. For each of the line-and-space patterns subjected to coating treatment using the coating agents of Examples and Comparative Examples, the roughness (LWR2, nm) of the lines in the line-and-space pattern subjected to coating treatment was also computed as in LWR1. From LWR1 and LWR2 computed, the reduction amount of LWR, ΔLWR (nm) was computed according to the following expression.

$$\Delta LWR = LWR1 - LWR2$$

Table 1 shows the reduction amounts of LWR, ΔLWR for the line-and-space patterns subjected to coating treatment using the coating agents of Examples and Comparative Examples. Note that a negative value of ΔLWR means that the LWR, which is an index for variations in the line width, after coating treatment with the coating agent is increased as compared with the untreated LWR.

[Evaluation of the Reduction Amount of Line Edge Roughness (LER)]

The line-and-space pattern before performing coating treatment was observed under a scanning electron microscope to measure line edge widths (the variation from the standard line) at 100 locations. The standard deviation (σ) in line edge widths was computed from the values of line edge widths at 100 locations. Subsequently, a 3-fold value (3σ) of the standard deviation was computed, and the value of 3σ was taken as the line edge roughness (LER1, nm) of the lines in the untreated line-and-space pattern. For each of the line-and-space patterns subjected to coating treatment using each of the coating agents of Examples and Comparative Examples, the line edge roughness (LER2, nm) in the line-and-space pattern subjected to coating treatment was also computed as in LER1. From LER1 and LER2 computed, the reduction amount of line edge roughness (LER), ΔLER (nm) was computed according to the following expression.

$$\Delta LER = LER1 - LER2$$

Table 1 shows the reduction amounts of LER, ΔLER for the line-and-space patterns subjected to coating treatment using the coating agents of Examples and Comparative Examples. Note that a negative value of ΔLER means that the LER, which is an index for variations in the smoothness of a side of a line (in other words, an index for the roughness of a side of a line), after coating treatment with the coating agent is increased as compared with the untreated LER.

[Evaluation of the Reduction Amount of Line Widths]

First, the line-and-space pattern before performing coating treatment was observed under a scanning electron microscope to measure line widths at 400 locations. The mean value of line width values at 400 locations was calculated, and the calculated mean value was taken as a line width W1 (nm). For each of the line-and-space patterns subjected to coating treatment using the coating agents of Examples or Comparative Examples, the mean value of line widths at 400 locations was also calculated, and the calculated mean value was taken as a line width W2 (nm). From W1 and W2 computed as described above, the reduction amount of line width ΔW (nm) was computed according to the following expression.

$$\Delta W = W1 - W2$$

Table 1 shows the reduction amount of line width ΔW for the line-and-space pattern subjected to coating treatment using each of the coating agents of Examples and Comparative Examples.

TABLE 1

| | Additive compound | LWR (nm) | LER (nm) | Reduction amount of LWR (nm) | Reduction amount of LER (nm) | Line width (nm) | Reduction amount of line width (nm) |
|---|---|---|---|---|---|---|---|
| Reference Example 1 (Without treatment) | None | 4.57 | 3.07 | — | — | 50.2 | — |
| Example 1 | Compound 1 | 4.33 | 2.90 | 0.24 | 0.17 | 49.1 | 1.1 |
| Comparative Example 1 | Comparative Compound 1 | 4.66 | 3.12 | −0.09 | −0.05 | 44.1 | 6.1 |
| Comparative Example 2 | Comparative Compound 2 | 4.75 | 3.14 | −0.18 | −0.07 | 44.4 | 5.8 |

Example 1 reveals that in a case where a positive-type resist pattern is treated by a predetermined method using a coating agent that is an aqueous solution containing a water-soluble polymer (resin) and Compound 1 as the amine compound (B), both of LWR and LER roughness of the positive-type resist pattern can be reduced. Comparative Example 1 and 2 reveal that in a case where a positive-type resist pattern is treated by a predetermined method using a coating agent that is an aqueous solution containing a water-soluble polymer (resin) and Comparative Compound 1 or 2 neither of which is the amine compound (B), neither LWR nor LER roughness of the positive-type resist pattern can be reduced. Note that the reduction amount of line width was low in a case where the coating agent of Example 1 was used compared to a case where the coating agent of Comparative Example 1 or 2 was used.

What is claimed is:

1. A method for forming a resist pattern in which roughness is reduced, the method comprising:
   coating a resist pattern on a substrate with a coat film comprising a coating agent; and removing the coat film from the surface of the resist pattern,
   wherein a side of a resist section of the resist pattern is dissolved along with the coat film, wherein the coating agent comprises a resin (A), an amine compound (B), and a solvent (S), and wherein the amine compound (B) is a compound represented by the following formula (1):

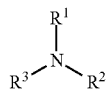

(1)

wherein $R^1$ represents an aliphatic hydrocarbon group having 8 to 20 carbon atoms and having 1 or more unsaturated double bond, $R^2$ represents a group represented by $-(A\text{-}O)_q-R^4$, $R^3$ represents a group represented by $-(A\text{-}O)_r-R^4$, A represents an ethylene group or a propylene group, $R^4$ represents a hydrogen atom or an alkyl group, q and r each independently represents a positive number, and q+r represents 4 or more.

2. The method according to claim 1, wherein the resin (A) is a water-soluble polymer or an alkali-soluble polymer.

3. The method according to claim 1, wherein the solvent (S) comprises water.

4. The method according to claim 1, further comprising a basic compound (C) other than the amine compound (B).

5. The method for forming a resist pattern according to claim 1, further comprising heating the resist pattern after coating with the coat film.

6. The method according to claim 1, wherein the amine compound (B) is a compound represented by the following formula:

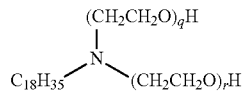

wherein $-C_{18}H_{35}$ represents an n-octadecenyl group, q and r each independently represents a positive number, and q+r represents 4 or more.

7. The method according to claim 1, wherein the resin (A) comprises polyvinylpyrrolidone.

* * * * *